United States Patent
Lin et al.

(10) Patent No.: US 9,570,654 B2
(45) Date of Patent: Feb. 14, 2017

(54) NITRIDE LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Wen-Yu Lin, Xiamen (CN); Meng-Hsin Yeh, Xiamen (CN); Zhibai Zhong, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/742,150

(22) Filed: Jun. 17, 2015

(65) Prior Publication Data

US 2015/0311389 A1    Oct. 29, 2015

Related U.S. Application Data

(63) Continuation of application No. PCT/CN2014/070989, filed on Jan. 21, 2014.

(30) Foreign Application Priority Data

Apr. 1, 2013  (CN) .......................... 2013 1 0108094

(51) Int. Cl.
*H01L 33/00* (2010.01)
*H01L 33/22* (2010.01)
(Continued)

(52) U.S. Cl.
CPC ........... *H01L 33/22* (2013.01); *H01L 21/0242* (2013.01); *H01L 21/0243* (2013.01);
(Continued)

(58) Field of Classification Search
CPC .......... H01L 2933/0025; H01L 33/007; H01L 33/0075; H01L 33/24; H01L 33/32
See application file for complete search history.

(56) References Cited

U.S. PATENT DOCUMENTS

| | | | |
|---|---|---|---|
| 6,720,586 B1 * | 4/2004 | Kidoguchi | .......... H01L 21/0237 257/103 |
| 2008/0054292 A1 * | 3/2008 | Guo | ........................ C30B 25/02 257/103 |

(Continued)

FOREIGN PATENT DOCUMENTS

CN        102169936 A        8/2011

*Primary Examiner* — Su C Kim
(74) *Attorney, Agent, or Firm* — Syncoda LLC; Feng Ma; Junjie Feng

(57) ABSTRACT

A nitride light-emitting diode including: a substrate with sub-micro patterns over the surface, which is divided into a growth region and a non-growth region; a growth blocking layer, formed in the non-growth region of the substrate for blocking epitaxial growth in the non-growth region of the substrate; a light-emitting epitaxial layer, comprising an n-type layer, a light-emitting layer and a p-type layer, formed in the growth region of the substrate, which extends to the non-growth region through lateral epitaxy and covers the growth blocking layer; wherein, the refractive index of the growth blocking layer is less than that of the light-emitting epitaxial layer and the growth blocking layer forms undulating morphology along the sub-micro patterns of the substrate, thus increasing light extraction interface of LED, generating refractive index difference between the light-emitting epitaxial layer and the light extraction interface and improving light extraction efficiency.

17 Claims, 8 Drawing Sheets

(51) Int. Cl.
  *H01L 33/44* (2010.01)
  *H01L 25/075* (2006.01)
  *H01L 27/15* (2006.01)
  *H01L 33/06* (2010.01)
  *H01L 33/24* (2010.01)
  *H01L 33/32* (2010.01)
  *H01L 33/12* (2010.01)
  *H01L 21/02* (2006.01)
  *H01L 33/20* (2010.01)

(52) U.S. Cl.
  CPC .... *H01L 21/0254* (2013.01); *H01L 21/02458* (2013.01); *H01L 21/02488* (2013.01); *H01L 21/02494* (2013.01); *H01L 21/02502* (2013.01); *H01L 21/02658* (2013.01); *H01L 25/0753* (2013.01); *H01L 27/15* (2013.01); *H01L 33/0075* (2013.01); *H01L 33/06* (2013.01); *H01L 33/12* (2013.01); *H01L 33/24* (2013.01); *H01L 33/32* (2013.01); *H01L 33/44* (2013.01); *H01L 33/007* (2013.01); *H01L 33/20* (2013.01); *H01L 2924/0002* (2013.01); *H01L 2933/0025* (2013.01)

(56) References Cited

U.S. PATENT DOCUMENTS

2010/0015739 A1  1/2010  Park
2012/0132951 A1* 5/2012  Son ...................... H01L 33/007
                                                           257/99

* cited by examiner

NITRIDE LIGHT EMITTING DIODE AND FABRICATION METHOD THEREOF

CROSS-REFERENCE TO RELATED APPLICATIONS

The present application is a continuation of, and claims priority to, PCT/CN2014/070989 filed on Jan. 21, 2014, which claims priority to Chinese Patent Application No. 201310108094.X filed on Apr. 1, 2013. The disclosures of these applications are hereby incorporated by reference in their entirety.

BACKGROUND

Nitride LED has been widely applied in such fields as display, indication, backlight source and lighting. As its luminous efficiency gets improved, the nitride LED is expected to replace incandescent lamp and fluorescent lamp and become a common lighting source over the next few years.

SUMMARY

The present disclosure aims at providing a new epitaxial substrate and designing an epitaxial structure over it so as to improve light extraction efficiency and internal quantum efficiency, thus improving light output power of LED.

According to a first aspect of present disclosure, a nitride LED, comprising: a substrate with sub-micro patterns over the surface, which is divided into a growth region and a non-growth region; a growth blocking layer, formed in the non-growth region of the substrate for blocking epitaxial growth in the non-growth region of the substrate; a light-emitting epitaxial layer, comprising an n-type layer, a light-emitting layer and a p-type layer, formed in the growth region of the substrate, which extends to the non-growth region through lateral epitaxy and covers the growth blocking layer; wherein, the refractive index of the growth blocking layer is less than that of the light-emitting epitaxial layer and the growth blocking layer forms undulating morphology along the sub-micro patterns of the substrate, thus increasing light extraction interface of LED, generating refractive index difference between the light-emitting epitaxial layer and the light extraction interface and improving light extraction efficiency.

Preferably, included angle α between the undulated surface and the plane surface of the growth blocking layer is 40°-70°, which is 60° preferably.

Preferably, distance h from top to bottom of the growth blocking layer is 200 nm-900 nm.

Preferably, the growth blocking layer is a series of discrete growth blocking material modules, appearing in massive or band-shaped distribution.

In some embodiments, the discrete growth blocking material modules appear periodic distribution with gaps of 100 nm-5000 nm.

In the above structure, the growth blocking layer can be made of oxide or nitride coating. In some embodiments, refractive index X of the growth blocking layer meets the conditions below: substrate<X<light-emitting epitaxial layer. For example, if the growth substrate is made of sapphire ($Al_2O_3$) and the growth blocking layer is made of silicon nitride ($Si_3N_4$), the refractive indices are as follows: gallium nitride: n≈2.5, sapphire: n≈1.8, and silicon nitride: n≈2.0. In some embodiments, refractive index X of the growth blocking layer meets the conditions below: X<substrate<light-emitting epitaxial layer. For example, if the growth substrate is made of sapphire ($Al_2O_3$) and the growth blocking layer is made of silicon dioxide ($SiO_2$), the refractive indices are as follows: gallium nitride: n≈2.5, sapphire: n≈1.8, and silicon dioxide: n≈1.48.

In some embodiments, by controlling pattern size of the growth substrate and thickness of the growth blocking layer, gaps are formed between the growth blocking layer and the epitaxial layer so as to increase refractive index difference of the light extraction interface.

According to a second aspect of present disclosure, a nitride LED fabrication method, comprising: providing a growth substrate with sub-micro patterns over the surface, which is divided into a growth region and a non-growth region; forming a growth blocking layer in the non-growth region of the substrate for blocking epitaxial growth in the non-growth region of the substrate; growing a light-emitting epitaxial layer, comprising an n-type layer, a light-emitting layer and a p-type layer in the growth region of the substrate, which extends to the non-growth region through lateral epitaxy and covers the growth blocking layer; wherein, the refractive index of the growth blocking layer is less than that of the light-emitting epitaxial layer and the growth blocking layer forms undulating morphology along the sub-micro patterns of the substrate, thus increasing light extraction interface of LED, generating refractive index difference between the light-emitting epitaxial layer and the light extraction interface and improving light extraction efficiency. In this substrate design, the non-growth region has powerful light reflection effect. And the growth region is also capable of reflection through the sub-micro patterned sapphire substrate, thus constituting a complete and compound reflective substrate.

In some embodiments, fabricate sub-micro convex-concave patterns over the growth substrate; divide the growth region and the non-growth region; form a growth blocking layer over the substrate surface and form undulating morphology over the sub-micro patterns of the substrate; remove the growth blocking layer in the growth region to expose the growth substrate surface; form a light-emitting epitaxial layer through epitaxial growth over the exposed growth substrate surface; and extend the light-emitting epitaxial layer to the non-growth region through lateral epitaxy and cover the growth blocking layer.

In some embodiments, by controlling pattern size of the growth substrate and thickness of the growth blocking layer, gaps are formed between the growth blocking layer and the epitaxial layer.

According to a third aspect of present disclosure, a lighting system or a display system, comprising: a series of LEDs, each LED comprising: a substrate with sub-micro patterns over the surface, which is divided into a growth region and a non-growth region; a growth blocking layer, formed in the non-growth region of the substrate for blocking epitaxial growth in the non-growth region of the substrate; a light-emitting epitaxial layer, comprising an n-type layer, a light-emitting layer and a p-type layer, formed in the growth region of the substrate, which extends to the non-growth region through lateral epitaxy and covers the growth blocking layer; wherein, the refractive index of the growth blocking layer is less than that of the light-emitting epitaxial layer and the growth blocking layer forms undulating morphology along the sub-micro patterns of the substrate, thus increasing light extraction interface of LED, generating refractive index difference between the light-emitting epitaxial layer and the light extraction interface and improving light extraction efficiency.

BRIEF DESCRIPTION OF THE DRAWINGS

FIGS. 2 and 3 give simple illustrations about the distribution method of the growth blocking layer, in which, FIG. 2 shows massive distribution and FIG. 3 shows band-shaped distribution.

DETAILED DESCRIPTION

In GaN LED, to improve external quantum efficiency (EQE), it is necessary to improve light extraction efficiency (LEE) and internal quantum efficiency (IQE) at first. Development of patterned sapphire substrate can increase light extraction efficiency and reduce defect density. On the one hand, by taking advantages of refractive index difference ($\Delta n$) between gallium nitride (n=2.5) and sapphire (n=1.8), the light originally reflected towards the sapphire substrate will change optical path and be reflected out of the LED; on the other hand, geometric patterns of the patterned sapphire substrate will lead to epitaxial lateral growth, resulting in dislocation bending and preventing it from running through to the surface.

On the basis of the patterned sapphire substrate of previous embodiments, a new epitaxial growth method is provided: fabricating the sub-micro patterns over the growth substrate surface; coating one oxide layer as the growth blocking layer in some part (i.e. the non-growth region) of the growth substrate; forming undulating morphology along the sub-micro patterns of the substrate; in the other region (i.e., the growth region) of the growth substrate, forming an epitaxial layer through epitaxial growth and extending it towards the non-growth region through lateral epitaxy and covering the growth blocking layer, thereby increasing light extraction interface of LED, generating refractive index difference between the light-emitting epitaxial layer and the light extraction interface and improving light extraction efficiency.

Detailed description will be given for some embodiments of present disclosure with a combination of drawings, which shall not restrict the scope of present disclosure.

Embodiment 1

A LED epitaxial structure design with lower refractive index coatings on sub-micro patterned substrate, more specifically, depositing an oxide layer over the substrate with sub-micro patterns; by taking advantages of the textured surface of the substrate; forming undulating oxide coating on the deposited oxide layer along the textured surface; patterning such undulating oxide coating after photolithography and etching to expose nitride material over the sub-micro patterned substrate and completing entire LED structure after epitaxy.

Figure 1:
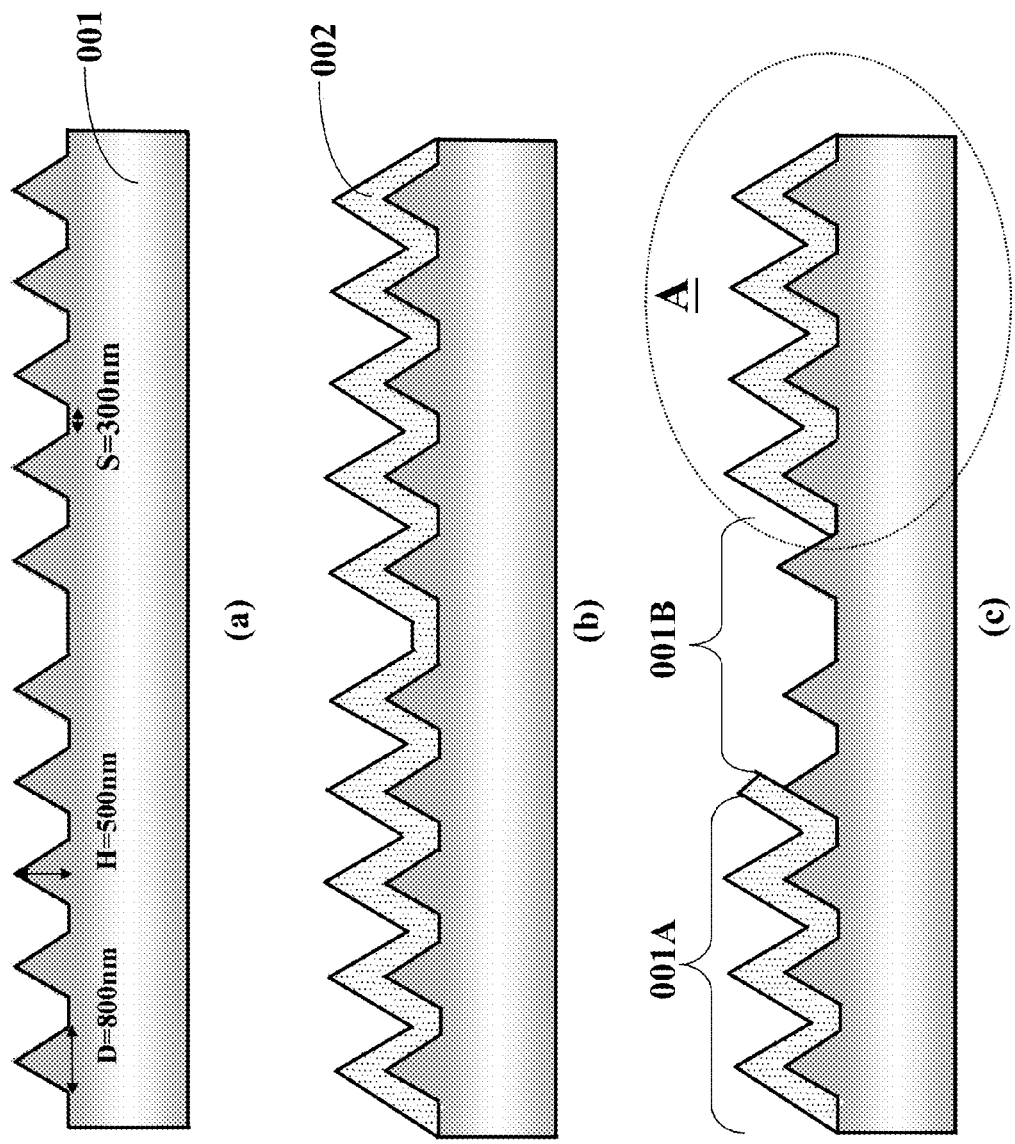
FIG. 1 is a process schematic diagram for epitaxial growth of a substrate according to the present disclosure, in which, panel (a) is a section view of the substrate with sub-micro patterns; panel (b) is a section view of the substrate coated with a growth blocking layer; and panel (c) is a section view of the exposed substrate surface after removal of the growth blocking layer in the growth region.
Figure 5:
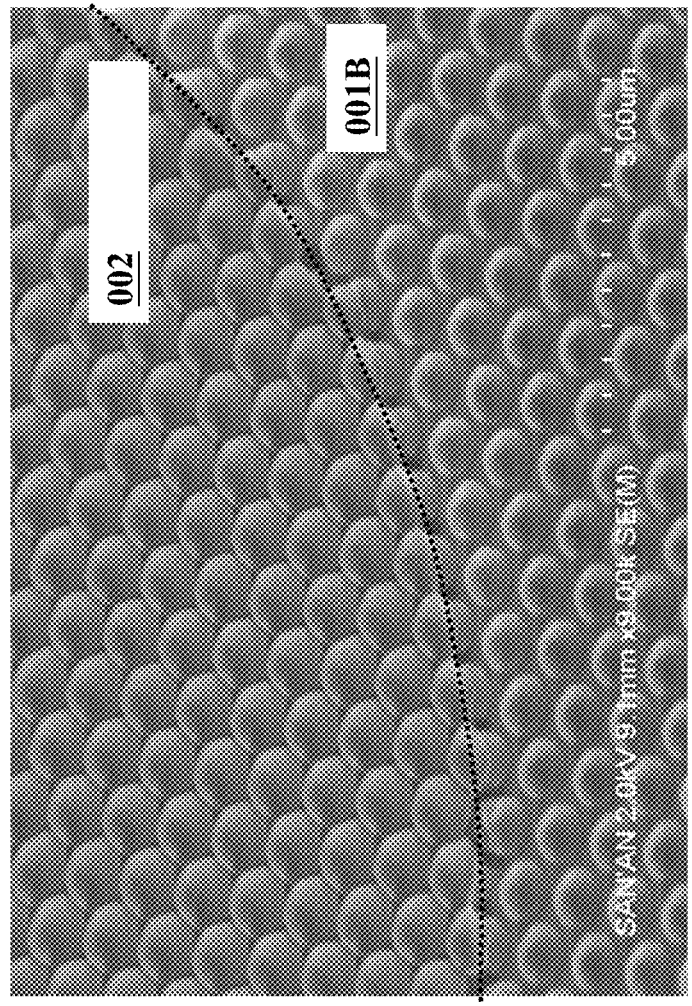
FIG. 5 is an actual scanning electron microscope (SEM) diagram of FIG. 1, panel (c).

FIG. 1 shows fabrication process of the epitaxial growth substrate. Provide a sub-micro patterned sapphire substrate 001, the surface of which has a series of convex patterns in periodic distribution; for each convex pattern, diameter D is 800 nm and height is 500 nm and space S between patterns is 300 nm. Refer to FIG. 1, panel (a) for the section view. Coat a $SiO_2$ coating 002 over the substrate 001; and the $SiO_2$ coating forms undulating morphology along the sub-micro patterned substrate with thickness of 400-500 nm. Refer to FIG. 1, panel (b) for the section view. Pattern the $SiO_2$ coating 002 to expose part of the sapphire substrate 001 to provide epitaxial growth region. Refer to FIG. 1, panel (c) for the section view. The region coated with the $SiO_2$ coating is a non-growth region 001A, and the region exposed over the sapphire substrate surface is the growth region 001B. The $SiO_2$ coating 002 is a growth blocking layer for blocking epitaxial growth in the non-growth region of the substrate. FIG. 5 is an actual scanning electron microscope (SEM) diagram of the processed substrate, in which, the upper part is the semi-growth region with surface coated with the $SiO_2$ coating 002 and the lower part is the growth region 001B.

Figure 2:
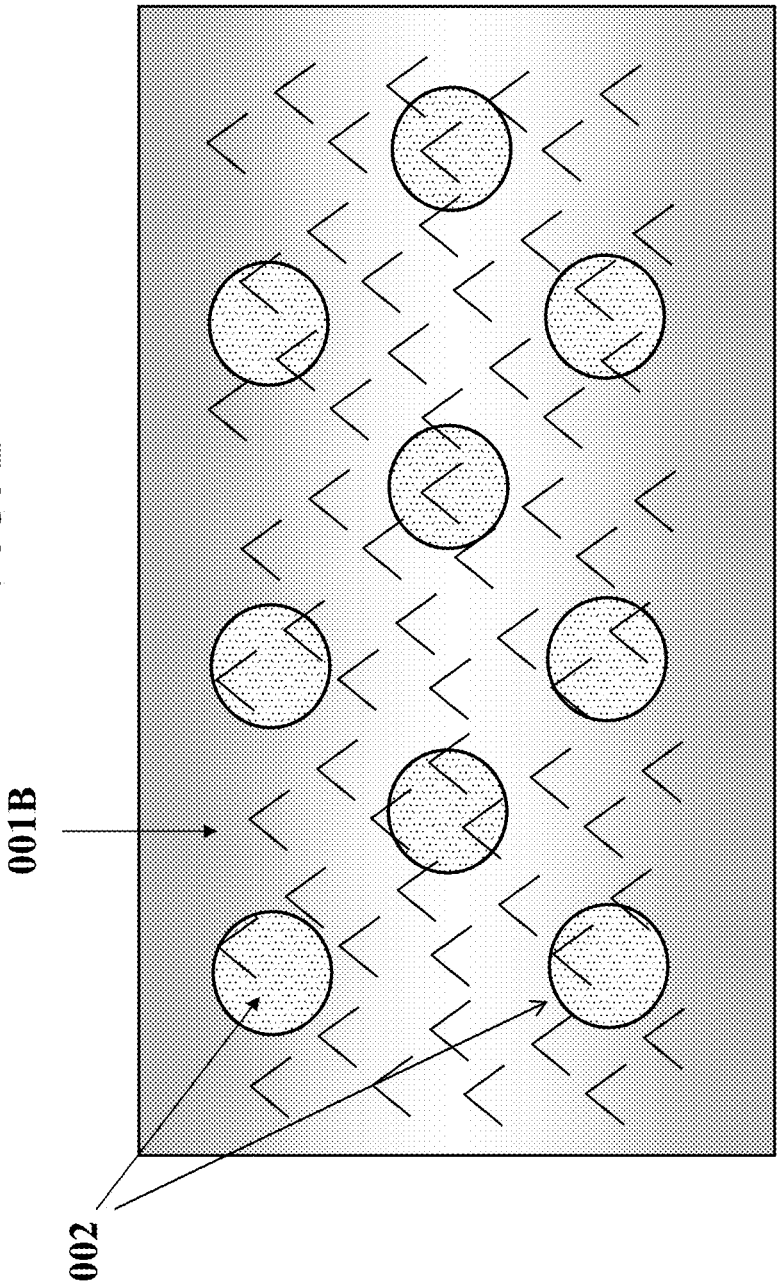
Figure 3:
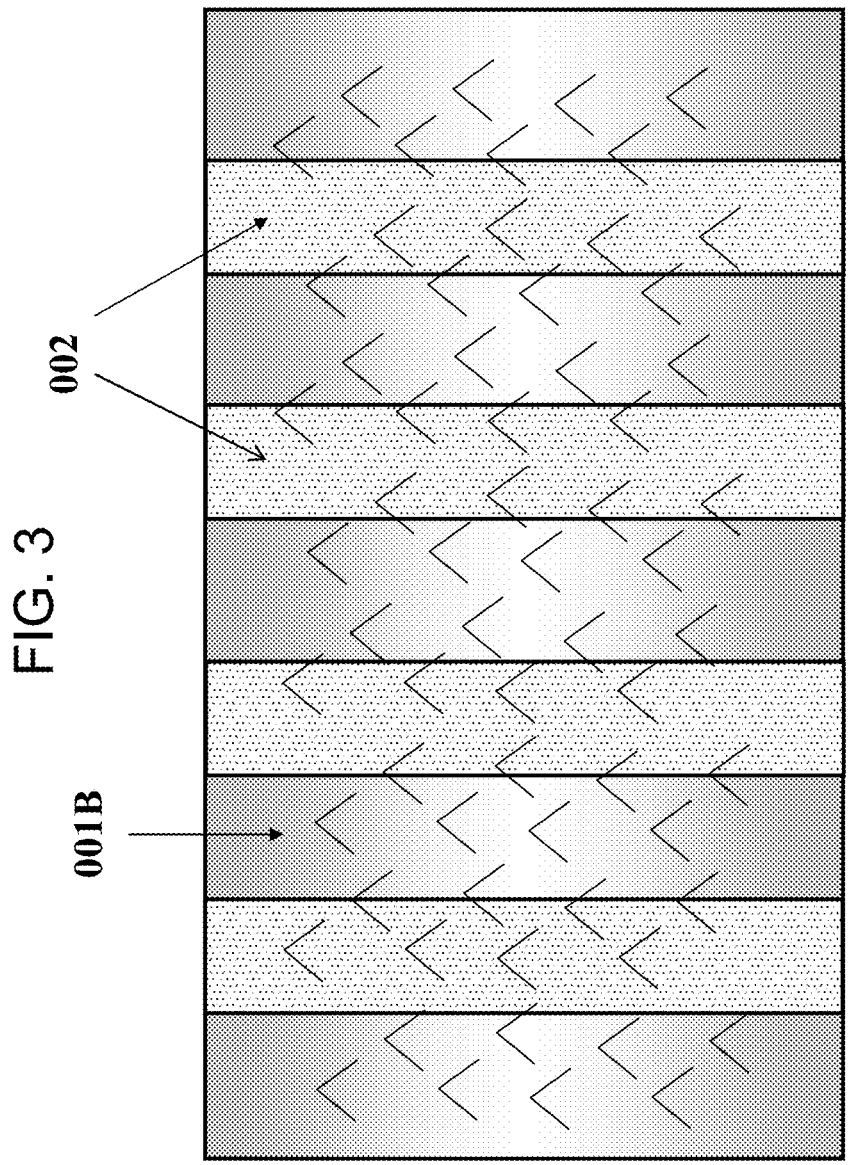
Figure 4:
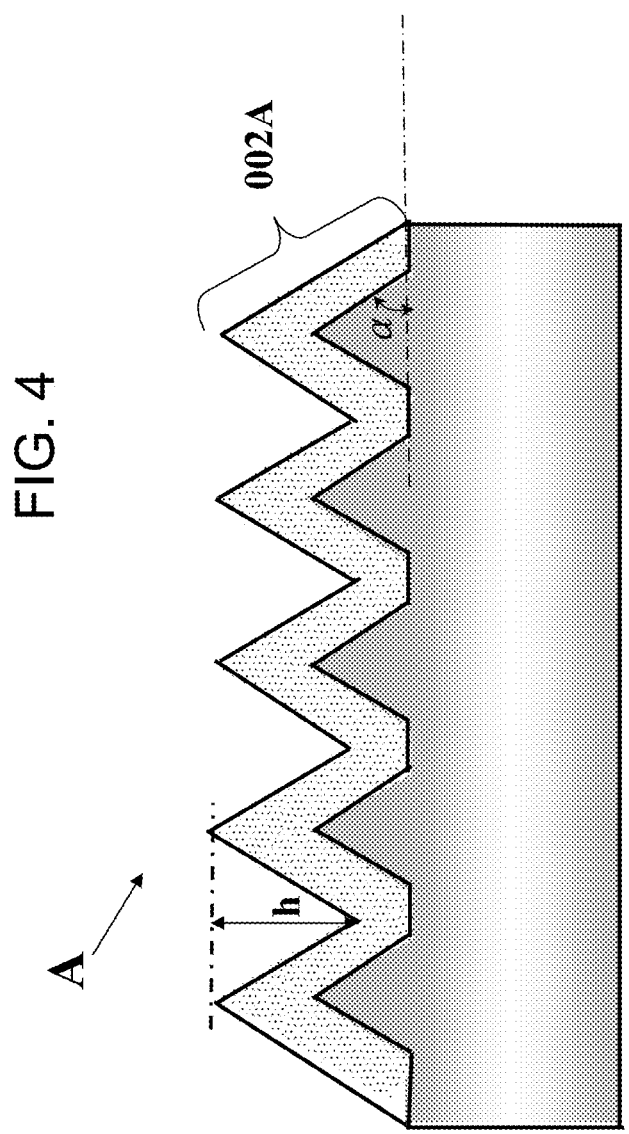
FIG. 4 is an enlarged view of Part A in FIG. 1, panel (c).

With reference to FIGS. 2 and 3, the $SiO_2$ coating 002 layer is a series of discrete growth blocking material modules, appearing in massive or band-shaped distribution each with gap of 100 nm-5000 nm. With reference to FIG. 4, an enlarged view of Part A in FIG. 1, panel.(c), each $SiO_2$ coating 002 comprises a series of undulated surfaces 002A, and the distance h from top to bottom of the undulated surface is 200 nm-900 nm, which is 500 nm preferably. The included angle $\alpha$ between the undulated surface 002A and the plane surface is 40°-70°, which is 60° preferably. In the LED light extraction surface, such angle scope can reach best light scattering probability.

Figure 6:
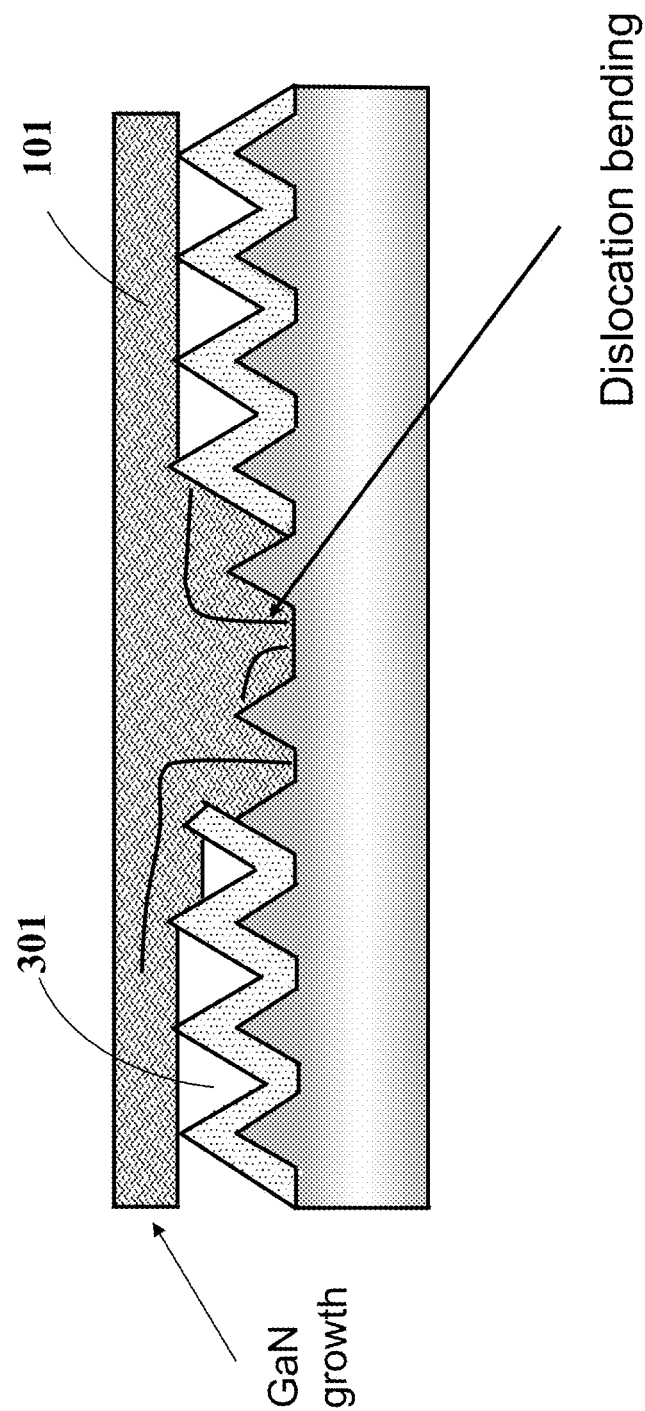
FIG. 6 is a section view of the substrate after epitaxial growth in FIG. 1, panel (c).
Figure 7:
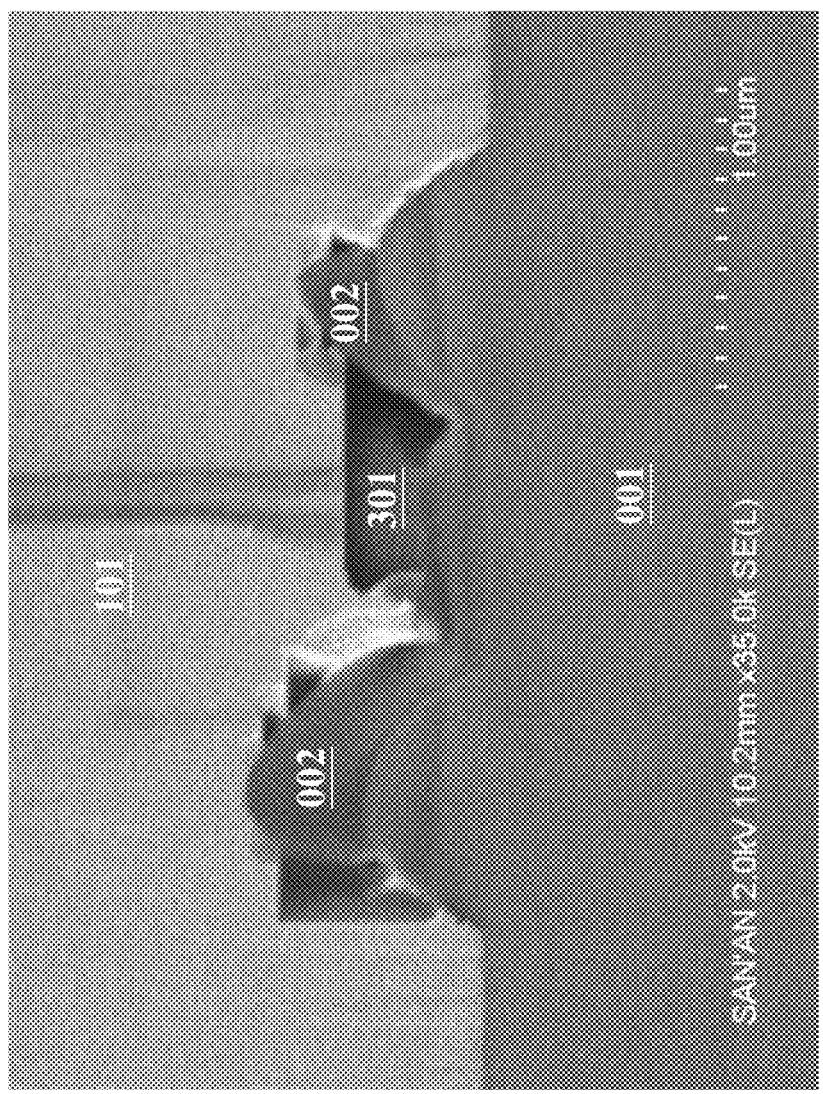
FIG. 7 is an actual scanning electron microscope (SEM) diagram of FIG. 6.

With reference to FIG. 6, grow the nitride buffer layer 101 in the growth region 001B over the processed substrate; extend the nitride buffer layer to the non-growth region 001A through lateral epitaxy and cover the $SiO_2$ coating 002, thus folding into a plane surface; and form gaps 301 between the $SiO_2$ coating 002 and the buffer layer 101. The buffer layer can be made of GaN, MN or other materials. FIG. 7 is an actual scanning electron microscope (SEM) diagram. Epitaxial growth with the processed substrate can result in dislocation bending and reduce defect density.

Figure 8:
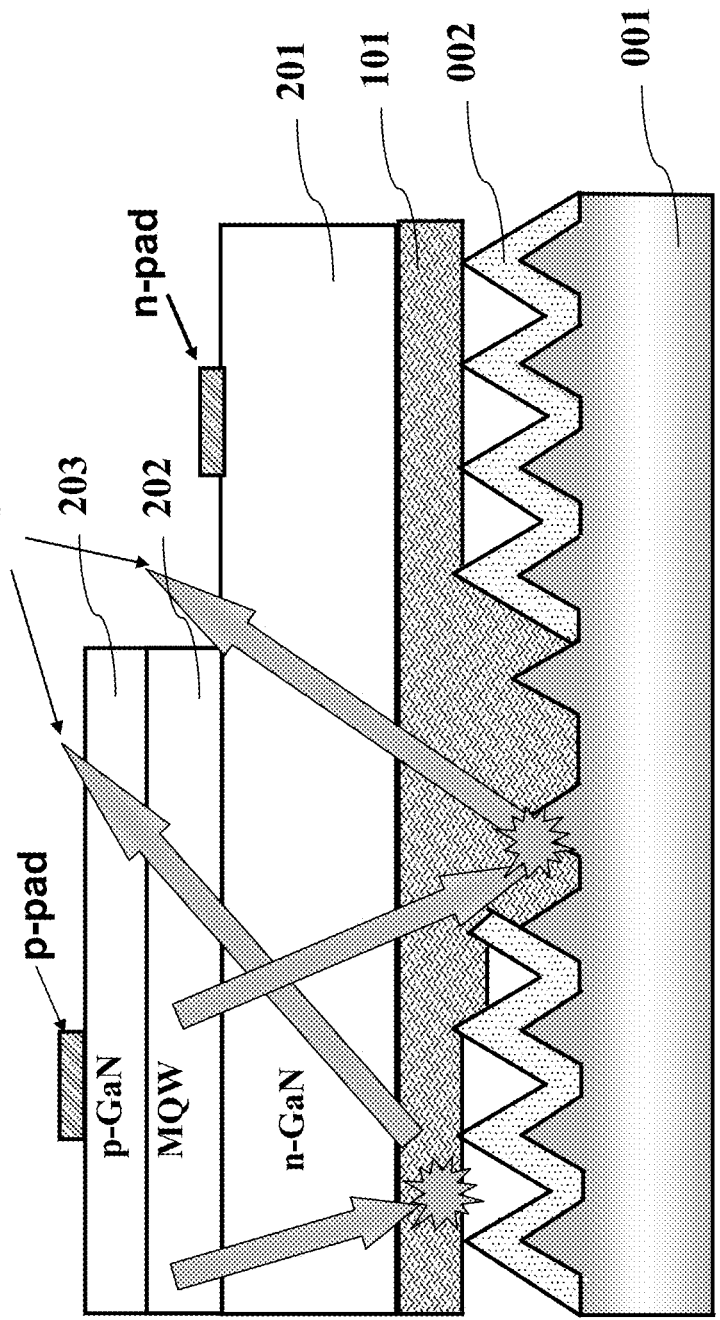
FIG. 8 is a section view of a nitride LED according to some embodiments.

With reference to FIG. 8, deposit an N-type conducting layer 201, a light-emitting layer 202 and a P-type conducting layer 203 in successive over the buffer layer 101 to form a light-emitting epitaxial layer 200. Fabricate LED chip with conventional chip process. The N-type conducting layer 201 is made of n-GaN layer; the light-emitting layer 202 generally is made of In gallium nitride compounds, which is a multi-quantum well structure preferably, and specifically, a layer comprising $In_{x1}Ga_{1-x1}N$ well layers ($0<x1<1$) and $In_{x2}Ga_{1-x2}N$ barrier layers ($0 \leq x2 < 1$, $x1 > x2$) after appropriate times of alternation. An electron blocking layer (not shown in the picture), generally made of AlGaN, can also be arrange between the light-emitting layer 202 and the P-type conducting layer; such electron blocking layer is about 10 nm-60 nm thick and has enough high barrier to restrict and prevent the N-type injected electron from overflowing to the P-type layer. The P-type conducting layer 203 is made of p-GaN layer.

In this embodiment, on the one hand, by importing $SiO_2$ coating over the sub-micro patterned substrate, an undulating morphology of $SiO_2$ coating is formed to generate a larger refractive index difference with the epitaxial layer and larger interface for reflecting and extracting the light emitted from the active region. On the other hand, compared with conventional sub-micro patterned substrate, this embodiment can provide more lateral growth and reduce defect density.

Embodiment 2

Different from Embodiment 1, this embodiment adopts silicon nitride as the growth blocking layer. In this embodiment, a gapless epitaxial layer is formed through epitaxial growth; refractive index of the silicon nitride is about 2.0, which is between that of the gallium nitride and the sapphire, thus meeting a graded refractive index (GRIN) relationship. The graded refractive index can reduce light loss over the interface and good for multiple guidance of light, thus extracting light from the semiconductor and increasing light output power.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A nitride light-emitting diode, comprising:
   a substrate having a surface with sub-micro patterns, including a growth region and a non-growth region;
   a growth blocking layer, formed in the non-growth region of the substrate for blocking epitaxial growth in the non-growth region of the substrate;
   a light-emitting epitaxial layer, comprising an n-type layer, a light-emitting layer, and a p-type layer, formed in the growth region of the substrate, extending to the non-growth region through lateral epitaxy and covering the growth blocking layer;
   wherein:
   a refractive index of the growth blocking layer is less than that of the light-emitting epitaxial layer, and the growth blocking layer forms undulating morphology along the sub-micro patterns of the substrate, thereby increasing a light extraction interface of light-emitting diode and generating a refractive index difference between the light-emitting epitaxial layer and the light extraction interface; and
   an angle α between an undulated surface and a plane surface of the growth blocking layer is formed to be 40°-70° to thereby increase light scattering probability and thereby improving the light extraction efficiency.

2. The nitride light-emitting diode of claim 1, wherein a gap exists between the growth blocking layer and the light-emitting epitaxial layer.

3. The nitride light-emitting diode of claim 1, wherein a distance h from top to bottom of the growth blocking layer is 200 nm-900 nm.

4. The nitride light-emitting diode of claim 1, wherein a refractive index X of the growth blocking layer meets conditions including: substrate<X<light-emitting epitaxial layer, thereby increasing a refractive index difference of the light extraction interface.

5. The nitride light-emitting diode of claim 1, wherein a refractive index X of the growth blocking layer meets conditions including: X<substrate<light-emitting epitaxial layer, thereby increasing refractive index difference of the light extraction interface.

6. The nitride light-emitting diode of claim 1, wherein the growth blocking layer comprises a series of discrete growth blocking material modules, appearing in a block-shaped or band-shaped distribution.

7. The nitride light-emitting diode of claim 1, wherein the growth blocking layer comprises an oxide coating or a nitride coating.

8. A nitride light-emitting diode fabrication method, comprising:
   providing a substrate having a surface with sub-micro patterns, including a growth region and a non-growth region;
   forming a growth blocking layer in the non-growth region of the substrate for blocking epitaxial growth in the non-growth region of the substrate;
   growing a light-emitting epitaxial layer, comprising a n-type layer, a light-emitting layer, and a p-type layer in the growth region of the substrate, extending to the non-growth region through lateral epitaxy and covering the growth blocking layer;
   wherein:
   a refractive index of the growth blocking layer is less than that of the light-emitting epitaxial layer, and the growth blocking layer forms undulating morphology along the sub-micro patterns of the substrate, thereby increasing a light extraction interface of light-emitting diode, generating a refractive index difference between the light-emitting epitaxial layer and the light extraction interface and improving light extraction efficiency; and
   an angle α between an undulated surface and a plane surface of the growth blocking layer is formed to be 40°-70° to thereby increase light scattering probability and thereby improving the light extraction efficiency.

9. A lighting or display system, comprising a plurality of light-emitting diodes, each light-emitting diode comprising:
   a substrate having a surface with sub-micro patterns, including a growth region and a non-growth region;
   a growth blocking layer, formed in the non-growth region of the substrate for blocking epitaxial growth in the non-growth region of the substrate;
   a light-emitting epitaxial layer, comprising a n-type layer, a light-emitting layer, and a p-type layer, formed in the growth region of the substrate, extending to the non-growth region through lateral epitaxy and covering the growth blocking layer;
   wherein:
   a refractive index of the growth blocking layer is less than that of the light-emitting epitaxial layer, and the growth blocking layer forms undulating morphology along the sub-micro patterns of the substrate, thereby increasing a light extraction interface of light-emitting diode and generating a refractive index difference between the light-emitting epitaxial layer and the light extraction interface; and
   an angle α between an undulated surface and a plane surface of the growth blocking layer is formed to be 40°-70° to thereby increase light scattering probability and thereby improving the light extraction efficiency.

10. The system of claim 9, wherein a gap exists between the growth blocking layer and the light-emitting epitaxial layer.

11. The system of claim 9, wherein a distance h from top to bottom of the growth blocking layer is 200 nm-900 nm.

12. The system of claim 9, wherein a refractive index X of the growth blocking layer meets conditions including: substrate<X<light-emitting epitaxial layer, thereby increasing a refractive index difference of the light extraction interface.

13. The system of claim 9, wherein a refractive index X of the growth blocking layer meets conditions including: X<substrate<light-emitting epitaxial layer, thereby increasing refractive index difference of the light extraction interface.

14. The system of claim 9, wherein the growth blocking layer comprises a series of discrete growth blocking material modules, appearing in a block-shaped or band-shaped distribution.

15. The system of claim 9, wherein the growth blocking layer comprises an oxide coating or a nitride coating.

16. The nitride light-emitting diode of claim 1, wherein the angle $\alpha$ is about 60°.

17. The system of claim 9, wherein the angle $\alpha$ is about 60°.

* * * * *